(12) United States Patent
Byom et al.

(10) Patent No.: US 8,522,055 B2
(45) Date of Patent: Aug. 27, 2013

(54) PEAK POWER VALIDATION METHODS AND SYSTEMS FOR NON-VOLATILE MEMORY

(75) Inventors: Matthew Byom, Campbell, CA (US); Hugo Fiennes, Palo Alto, CA (US); Arjun Kapoor, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 452 days.

(21) Appl. No.: 12/843,438

(22) Filed: Jul. 26, 2010

(65) Prior Publication Data
US 2012/0023356 A1 Jan. 26, 2012

(51) Int. Cl.
G06F 1/26 (2006.01)
G06F 1/00 (2006.01)
G06F 13/00 (2006.01)
F02P 3/02 (2006.01)

(52) U.S. Cl.
USPC ............ 713/300; 713/340; 711/100; 323/371

(58) Field of Classification Search
None
See application file for complete search history.

(56) References Cited

U.S. PATENT DOCUMENTS

| | | | |
|---|---|---|---|
| 5,724,592 A | 3/1998 | Garner | |
| 6,478,441 B2 | 11/2002 | Lam | |
| 6,564,333 B1 * | 5/2003 | Ho et al. ........................ | 713/340 |
| 6,748,493 B1 | 6/2004 | Arroyo et al. | |
| 7,305,572 B1 | 12/2007 | Burroughs et al. | |
| 7,440,215 B1 | 10/2008 | Sardella et al. | |
| 2002/0181311 A1 | 12/2002 | Miyauchi et al. | |
| 2003/0126475 A1 | 7/2003 | Bodas | |
| 2005/0125703 A1 | 6/2005 | Lefurgy et al. | |
| 2006/0082222 A1 | 4/2006 | Pincu et al. | |
| 2006/0184758 A1 | 8/2006 | Satori et al. | |
| 2006/0288241 A1 | 12/2006 | Felter et al. | |
| 2007/0211551 A1 | 9/2007 | Yogev et al. | |
| 2008/0052544 A1 * | 2/2008 | Hsieh et al. .................... | 713/300 |
| 2008/0126686 A1 * | 5/2008 | Sokolov et al. ............... | 711/103 |
| 2008/0320323 A1 * | 12/2008 | Brittain et al. ................ | 713/340 |
| 2009/0083556 A1 * | 3/2009 | Zimek et al. ................... | 713/310 |
| 2009/0265564 A1 * | 10/2009 | Clemo et al. .................. | 713/300 |
| 2009/0307514 A1 * | 12/2009 | Roberts et al. ................ | 713/330 |

(Continued)

FOREIGN PATENT DOCUMENTS

| | | |
|---|---|---|
| EP | 0878755 | 11/1998 |
| EP | 0955573 | 11/1999 |

(Continued)

*Primary Examiner* — Ji H Bae
(74) *Attorney, Agent, or Firm* — Van Court & Aldridge LLP

(57) ABSTRACT

Systems and methods are disclosed for validating a non-volatile memory (NVM) package for use in an electronic device before it is incorporated into the device. A NVM package may be validated by determining its power consumption profile, and if the profile meets predetermined criteria, that NVM package may be qualified for use in an electronic system. The power consumption profile may be obtained by issuing commands, such as read commands, to the NVM package to simultaneously access each die of the NVM package to invoke a maximum power consumption event. During this event, power consumption by the NVM package can be monitored and analyzed to determine whether the NVM package qualifies for use in an electronic device.

17 Claims, 6 Drawing Sheets

(56) References Cited

U.S. PATENT DOCUMENTS

| | | | |
|---|---|---|---|
| 2010/0005330 A1* | 1/2010 | Taylor et al. | 713/340 |
| 2010/0036998 A1 | 2/2010 | Ben-Rubi | |
| 2010/0049905 A1* | 2/2010 | Ouchi | 711/103 |
| 2010/0077238 A1* | 3/2010 | Vogman et al. | 713/310 |
| 2010/0162006 A1 | 6/2010 | Therien et al. | |
| 2010/0293439 A1 | 11/2010 | Flynn et al. | |
| 2010/0293440 A1 | 11/2010 | Thatcher et al. | |
| 2011/0157934 A1* | 6/2011 | Clemo et al. | 363/71 |
| 2011/0307721 A1* | 12/2011 | Ouchi et al. | 713/321 |

FOREIGN PATENT DOCUMENTS

| | | |
|---|---|---|
| EP | 1688866 | 8/2006 |
| EP | 1818830 | 8/2007 |
| WO | 03/029951 | 4/2003 |
| WO | 2006/059698 | 6/2006 |
| WO | 2007/024396 | 3/2007 |
| WO | 2008/017624 | 2/2008 |

\* cited by examiner

US 8,522,055 B2

PEAK POWER VALIDATION METHODS AND SYSTEMS FOR NON-VOLATILE MEMORY

FIELD OF THE INVENTION

This can relate to determining peak power consumption of non-volatile memory, such as a NAND flash memory.

BACKGROUND OF THE DISCLOSURE

Non-volatile memory (NVM) such as Nand Flash NVM have die lithographies that continue to shrink with each generation. As a result, power consumption of the NVM increases along with its corresponding increase in storage density. Electronic systems that use such NVMs need to be able to adequately meet the increased power demands. For example, a power management unit of the electronic system needs to supply the minimum quantity of power required by the NVM. However, due to variances in manufacturing processes of NVMs, the power consumption of the NVMs may vary from one NVM to another. For example, one NVM may consume more power than that which can be supplied by the power management unit. Thus, if this NVM is incorporated into the electronic system, the system may experience a failure when the NVM attempts to pull more power than can be supplied.

SUMMARY OF THE DISCLOSURE

Systems and methods are disclosed for validating a NVM for use in an electronic device before it is incorporated into the device. A NVM may be validated by determining its power consumption profile, and if the profile meets predetermined criteria, that NVM may be qualified for use in an electronic system.

In one embodiment, a power consumption profile of a NVM can be determined by providing power to the NVM package, issuing commands to the NVM package so that each die is simultaneously accessed, and monitoring NVM package power consumption during the simultaneous access of each die to obtain a power consumption profile of the NVM package. Based on the power consumption profile, such as a peak power consumption value, a determination can be made whether the NVM package is suitable for use in an electronic device.

In another embodiment, a testing system may be provided to qualify NVM packages for use in an electronic system. The testing system can include power monitoring circuitry for monitoring power consumed by a NVM package during testing. The testing system can include testing circuitry operative to issue commands to the NVM package to simultaneously access each of the plurality of die to thereby invoke a maximum power consumption event by the NVM package, receive power consumption data from the power monitoring circuitry, analyze the received power consumption data, and qualify the NVM package for use in an electronic device based on analysis of the received power consumption data.

In another embodiment, NVM packages can be matched to power management units based on their power profiles. An NVM package can be matched to power management unit by ascertaining a power consumption profile of the NVM package. The profile can include a peak power consumption value, and the NVM package can include several die. The NVM package can be matched to a power management unit (PMU) capable of supplying power to satisfy the peak power consumption value. When matched, the NVM package and the PMU can be used in an electronic device.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

Figure 1:
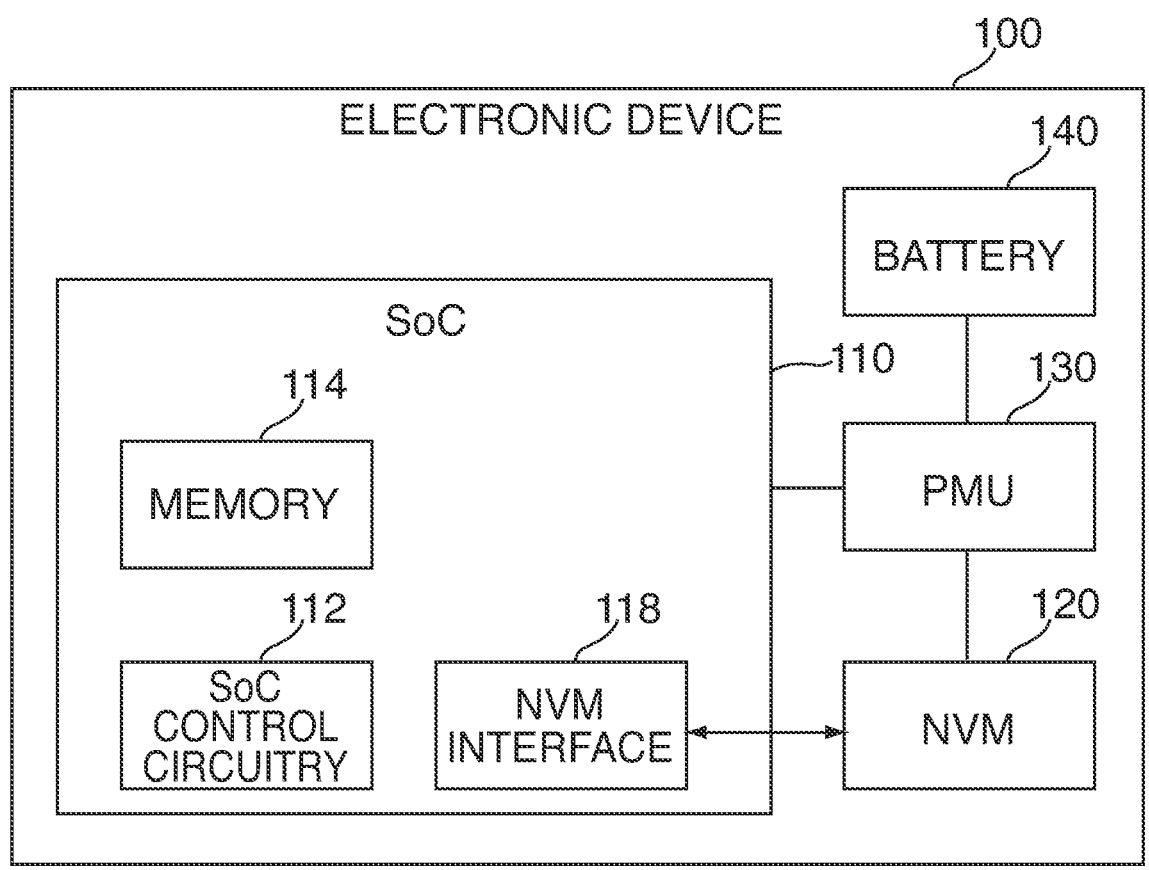
FIG. 1 is a schematic view of an electronic device configured in accordance with various embodiments of the invention.

FIG. 1 is a schematic view of electronic device 100. In some embodiments, electronic device 100 can be or can include a portable media player (e.g., an iPod™ made available by Apple Inc. of Cupertino, Calif.), a cellular telephone (e.g., an iPhone™ made available by Apple Inc.), a pocket-sized personal computer, a personal digital assistance ("PDA"), a desktop computer, a laptop computer, and any other suitable type of electronic device.

Electronic device 100 can include system-on-a-chip ("SoC") 110, non-volatile memory ("NVM") 120, power management unit (PMU) 130, and battery 140. Non-volatile memory 120 can include a NAND flash memory based on floating gate or charge trapping technology, NOR flash memory, erasable programmable read only memory ("EPROM"), electrically erasable programmable read only memory ("EEPROM"), Ferroelectric RAM ("FRAM"), magnetoresistive RAM ("MRAM"), any other known or future types of non-volatile memory technology, or any combination thereof. NVM 120 can be organized into "blocks," which are the smallest unit of erase, and further organized into "pages," which are the smallest that can programmed and/or read. In some embodiments, NVM 120 can include multiple integrated circuits, where each integrated circuit may have multiple blocks. The blocks from corresponding integrated circuits (e.g., blocks having the same position or block number) may form "super blocks." Each memory location (e.g., page or block) of NVM 120 can be addressed using a physical address (e.g., a physical page address or physical block address).

PMU 130 can include circuitry for managing distribution of power to components in electronic device 100. For example, PMU 130 may regulate power provided by battery 140 to SOC 110 and NVM 120. PMU 130 may limit the quantity of power that may be provided by any of the components. The power limit may be a protection mechanism or a function of its construction. In fact, due to manufacturing differences in silicon, some PMUs may conduct more power than other PMUs.

Battery 140 may be any suitable battery for supplying power to electronic device 100. For example, battery 140 may be a lithium ion battery. If desired, an alternative power source can be used to power electronic device 100 such as a fuel cell or solar cell.

FIG. 1, as well as later figures and various disclosed embodiments, may sometimes be described in terms of using flash technology. However, this is not intended to be limiting, and any other type of non-volatile memory can be implemented instead. Electronic device 100 can include other components, such as a power supply or any user input or output components, which are not depicted in FIG. 1 to prevent overcomplicating the figure.

System-on-a-chip 110 can include SoC control circuitry 112, memory 114, and NVM interface 118. SoC control circuitry 112 can control the general operations and functions of SoC 110 and the other components of SoC 110 or device 100. For example, responsive to user inputs and/or the instructions of an application or operating system, SoC control circuitry 112 can issue read or write commands to NVM interface 118 to obtain data from or store data in NVM 120. For clarity, data that SoC control circuitry 112 may request for storage or retrieval may be referred to as "user data," even though the data may not be directly associated with a user or user application. Rather, the user data can be any suitable sequence of digital information generated or obtained by SoC control circuitry 112 (e.g., via an application or operating system).

SoC control circuitry 112 can include any combination of hardware, software, and firmware, and any components, circuitry, or logic operative to drive the functionality of electronic device 100. For example, SoC control circuitry 112 can include one or more processors that operate under the control of software/firmware stored in NVM 120 or memory 114.

Memory 114 can include any suitable type of volatile or non-volatile memory, such as dynamic random access memory ("DRAM"), synchronous dynamic random access memory ("SDRAM"), double-data-rate ("DDR") RAM, cache memory, read-only memory ("ROM"), or any combination thereof. Memory 114 can include a data source that can temporarily store user data for programming into or reading from non-volatile memory 120. In some embodiments, memory 114 may act as the main memory for any processors implemented as part of SoC control circuitry 112.

NVM interface 118 may include any suitable combination of hardware, software, and/or firmware configured to act as an interface or driver between SoC control circuitry 112 and NVM 120. For any software modules included in NVM interface 118, corresponding program code may be stored in NVM 120 or memory 114.

NVM interface 118 can perform a variety of functions that allow SoC control circuitry 112 to access NVM 120 and to manage the memory locations (e.g., pages, blocks, super blocks, integrated circuits) of NVM 120 and the data stored therein (e.g., user data). For example, NVM interface 118 can interpret the read or write commands from SoC control circuitry 112, perform wear leveling, and generate read and program instructions compatible with the bus protocol of NVM 120.

While NVM interface 118 and SoC control circuitry 112 are shown as separate modules, this is intended only to simplify the description of the embodiments of the invention. It should be understood that these modules may share hardware components, software components, or both. For example, a processor implemented as part of SoC control circuitry 112 may execute a software-based memory driver for NVM interface 118. Accordingly, portions of SoC control circuitry 112 and NVM interface 118 may sometimes be referred to collectively as "control circuitry."

FIG. 1 illustrates an electronic device where NVM 120 may not have its own controller. In other embodiments, electronic device 100 can include a target device, such as a flash or SD card, that includes NVM 120 and some or all portions of NVM interface 118 (e.g., a translation layer, discussed below). In these embodiments, SoC 110 or SoC control circuitry 112 may act as the host controller for the target device. For example, as the host controller, SoC 110 can issue read and write requests to the target device.

Figure 2A:
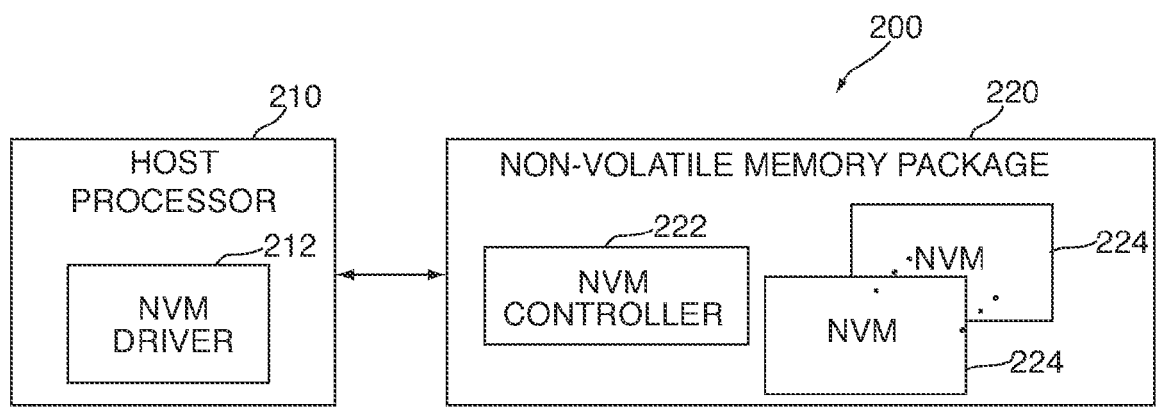
FIG. 2A is a schematic view of an illustrative system including a host processor and a managed non-volatile memory package configured in accordance with various embodiments of the invention.
Figure 2B:
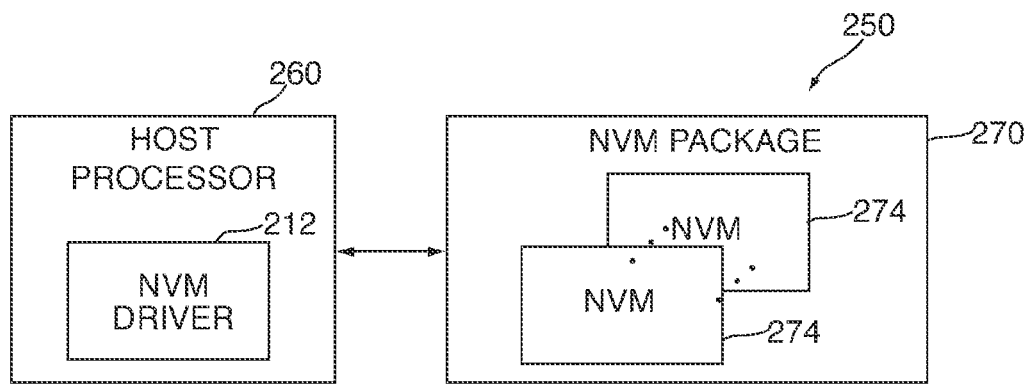
FIG. 2B is a schematic view of an illustrative system including a host processor and a raw non-volatile memory package configured in accordance with various embodiments of the invention.

FIGS. 2A and 2B are schematic views of systems, which are examples of various embodiments of embodiment 100 of FIG. 1. Looking first to FIG. 2A, system 200 can include host processor 210 and at least one non-volatile memory ("NVM") package 220. Host processor 210 and optionally NVM package 220 can be implemented in any suitable host device or system, such as a portable media player (e.g., an iPod™ made available by Apple Inc. of Cupertino, Calif.), a cellular telephone (e.g., an iPhone™ made available by Apple Inc.), a pocket-sized personal computer, a personal digital assistance ("PDA"), a desktop computer, or a laptop computer.

Host processor 210 can include one or more processors or microprocessors that are currently available or will be developed in the future. Alternatively or in addition, host processor 210 can include or operate in conjunction with any other components or circuitry capable of controlling various operations of memory system 200 (e.g., application-specific integrated circuits ("ASICs")). In a processor-based implementation, host processor 210 can execute firmware and software programs loaded into a memory (not shown) implemented on the host. The memory can include any suitable type of volatile memory (e.g., cache memory or random access memory ("RAM"), such as double data rate ("DDR") RAM or static RAM ("SRAM")). Host processor 210 can execute NVM driver 212, which may provide vendor-specific and/or technology-specific instructions that enable host processor 210 to perform various memory management and access functions for non-volatile memory package 220. Host processor 210 can perform any of the functions of SoC 110 (of FIG. 1).

NVM package 220 may be a ball grid array ("BGA") package or other suitable type of integrated circuit ("IC") package. NVM package 220 may be managed NVM package. In particular, NVM package 220 can include NVM controller 222 coupled to any suitable number of NVM dies 224. NVM controller 222 may include any suitable combination of processors, microprocessors, or hardware-based components (e.g., ASICs), and may include the same components as or different components from host processor 210. NVM controller 222 may share the responsibility of managing and/or accessing the physical memory locations of NVM dies 224 with NVM driver 212. Alternatively, NVM controller 222 may perform substantially all of the management and access functions for NVM dies 224. Thus, a "managed NVM" may refer to a memory device or package that includes a controller (e.g., NVM controller 222) configured to perform at least one memory management function for a non-volatile memory (e.g., NVM dies 224). Memory management and access functions that may be performed by NVM controller 222 and/or host processor 210 for NVM dies 224 can include issuing read, write, or erase instructions and performing wear leveling, bad block management, garbage collection, logical-to-physical address mapping, SLC or MLC programming decisions, applying error correction or detection, and data queuing to set up program operations.

NVM dies 224 may be used to store information that needs to be retained when memory system 200 is powered down. As used herein, and depending on context, a "non-volatile memory" can refer to NVM dies in which data can be stored, or may refer to a NVM package that includes the NVM dies.

Referring now to FIG. 2B, a schematic view of system 250 is shown, which may be an example of another embodiment of electronic device 100 of FIG. 1. System 250 may have any of the features and functionalities described above in connection with system 200 of FIG. 2A. In particular, any of the components depicted in FIG. 2B may have any of the features and functionalities of like-named components in FIG. 2A, and vice versa.

System 250 can include host processor 260 and non-volatile memory package 270. Unlike memory system 200 of FIG. 2A, NVM package 270 does not include an embedded NVM controller, and therefore NVM dies 274 may be managed entirely by host processor 260 (e.g., via NVM driver 262). Thus, non-volatile memory package 270 may be referred to as a "raw NVM." A "raw NVM" may refer to a memory device or package that may be managed entirely by a host controller or processor (e.g., host processor 260) implemented external to the NVM package. Host processor 260 may perform any of the other memory management and access functions discussed above in connection with host processor 210 and NVM controller 222 of FIG. 2A. In addition, host processor 260 may perform any of the functions of SoC 110 (of FIG. 1).

With continued reference to both FIGS. 2A and 2B, NVM controller 222 (FIG. 2A) and host processor 270 (e.g., via NVM driver 262) (FIG. 2B) may each embody the features and functionality of SoC 110 discussed above in connection with FIG. 1, and NVM dies 224 and 274 may embody respective power consumption profiles that may be ascertained using various embodiments of the invention. In particular, NVM dies 224 and 274 may each have a peaky current profile, where the highest peaks occur when a die is performing its most power-intensive operations. In flash memory embodiments, an example of such a power-intensive operation is a sensing operation (e.g., current sensing operation), which may be used when reading data stored in memory cells. Such sensing operations may be performed, for example, responsive to read requests from a host processor and/or a NVM controller when verifying that data was properly stored after programming.

Figure 2C:
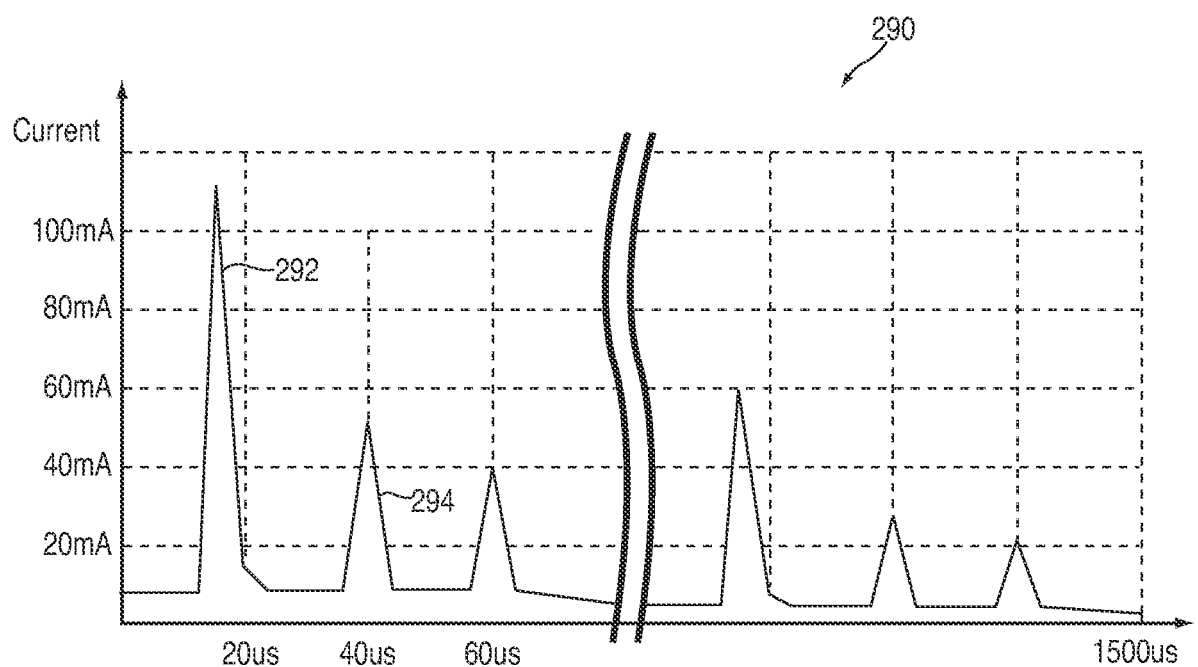
FIG. 2C is a graph illustrating a current consumption profile of a NVM package in accordance with various embodiments of the invention.

FIG. 2C shows illustrative current consumption profile 290. Current consumption profile 290 gives an example of the current consumption of a NVM die (e.g., one of NVM dies 224 or 274) during a verification-type sensing operation. With several peaks, including peaks 292 and 294, current consumption profile 290 illustrates how peaky a verification-type sensing operation may be. These verification-type sensing operations may be of particular concern, as these operations may be likely to occur across multiple NVM dies at the same time (i.e., due to employing parallel writes across multiple dies). Thus, if not managed by NVM controller 222 (FIG. 2A) or host processor 260, the peaks of different NVM dies may overlap and the total current sum may be unacceptably high. This situation may occur with other types of power-intensive operations, such as erase and program operations.

FIG. 2C shows an illustrative current consumption profile for one die. However, NVM typically includes multiple die (e.g., 2, 4, 8, 16) die per NVM package. Thus, when each die is simultaneously accessed (e.g., by way of a program, read, erase, or a combination thereof), the cumulative current consumption profile can be significantly higher than that of a single die. The cumulative current consumption profile may be obtained by testing a NVM package according to various embodiments of the invention.

Figure 3:
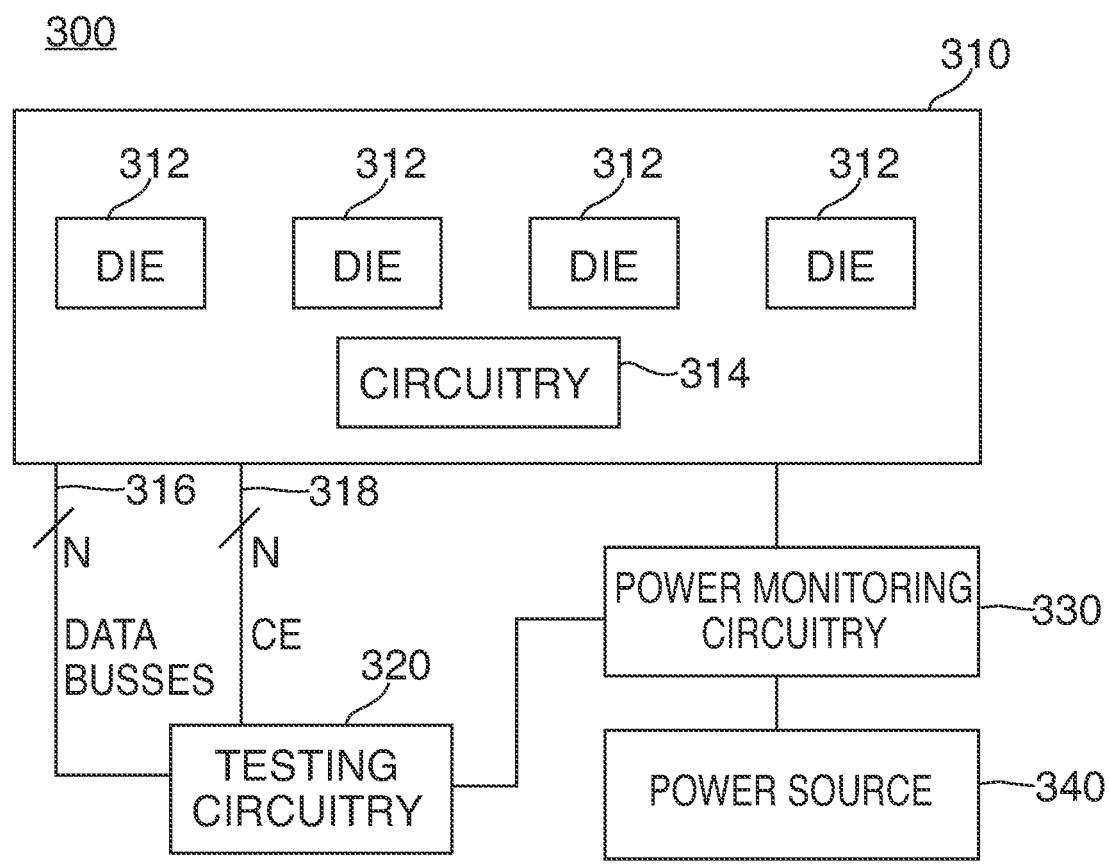
FIG. 3 is an illustrative block diagram of NVM package testing system in accordance with various embodiments of the invention.

Referring now to FIG. 3 an illustrative peak power testing system 300 is shown. Test system 300 can include NVM package 310, which can include multiple dies 312 and circuitry 314, testing circuitry 320, power monitoring circuitry 330, and power source 340. Only four dies 312 are shown, but it is understood that any number of dies may be included. Circuitry 314 can be circuitry for enabling conventional operations of NVM package 310 such as programming, reading, and erasing operations. For example, circuitry 314 can include charge pumps, row and column decoders, buffers, and any other suitable circuitry. NVM package 310 can include data busses 316 for enabling transfer of data to/from NVM package 310. In some embodiments, the number of data busses may be less than the number of dies 312. NVM package 310 can also include chip enable lines 318 for selectively enabling dies 312.

Each die 312 can include a predetermined number of physical blocks and each block can include a predetermined number of pages. Pages and blocks represent physical locations of memory cells within die 312. Blocks are the smallest erasable unit of memory cells and pages are smallest unit of data that can be programmed or read at a time within a block. Cells with the pages or blocks can be accessed using addressing circuitry (e.g., circuitry 314) associated with the NVM package in which the cells reside. Only one block per plane can be accessed at any given time.

In some embodiments, blocks from two or more dies can be virtually linked together to form a superblock. For example, respective blocks in all four dies 312 can be virtually linked together to form a superblock. Blocks need not be in the same row of each plane to be virtually linked as a superblock. For example, blocks may be chosen randomly from two or more dies to form a superblock. In some embodiments, blocks may be chosen from two or more planes, in which blocks in each plane are simultaneously accessible. Superblocks provide operational parallelism, thereby enabling programming, reading, and erase operations to be performed on blocks located in different planes in parallel. In another embodiment, pages from two or more planes may be virtually linked together to form superpages. A translation layer being implemented in an NVM interface may keep track of superblocks or superpages.

Power monitoring circuitry 330 may be electrically coupled to NVM package 310 and power source 340. Power monitoring circuitry 330 may monitor power being supplied to NVM package 310. In some embodiments, circuitry 330 can monitor the current being consumed by NVM package 310. In another embodiment, circuitry 330 can monitor the voltage being supplied to NVM package 330. Regardless of whether it is power, current, voltage, or a combination thereof, circuitry 330 can provide its monitored readings to testing circuitry 320.

Testing circuitry 320 can function as the control center for testing NVM package 310. Testing circuitry 330 may be electrically coupled to NVM package 310 via data busses 316 or chip enable lines 318 and may also be electrically coupled to power monitoring circuitry 330. Testing circuitry 330 can perform one or more tests on NVM package 310 to obtain power consumption data during those tests. For example, testing circuitry 330 can issue commands such as read or program commands to NVM package 310 and while those commands are executed, power monitoring circuitry 330 may relay monitored power information to testing circuitry 330 for recording and further analysis. By issuing these commands, testing circuitry 320 can obtain power consumption profiles for each die 312 independently, a subset of all the dies 312 in NVM package 310, or a combination of all dies 312 in NVM package 310.

Figure 4:
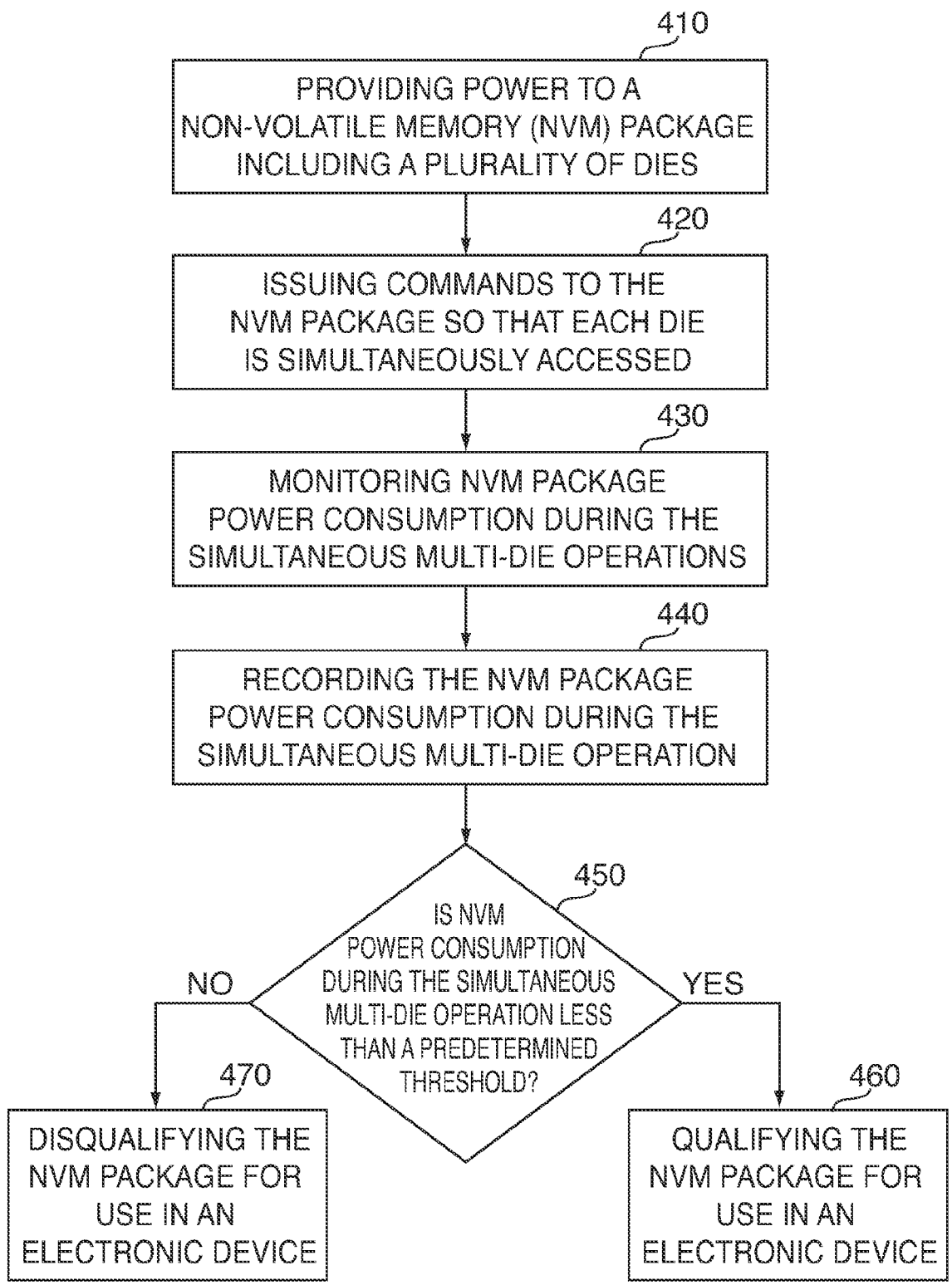
FIG. 4 is an illustrative flowchart showing steps that for obtaining a power consumption profile of one or more dies in a NVM package in accordance with various embodiments of the invention.

FIG. 4 is an illustrative flowchart showing steps for obtaining a power consumption profile of one or more dies in a NVM package according to an embodiment of the invention. Starting with step 410, power can be provided to a NVM package including a plurality of dies (e.g., NVM package 310 with multiple dies 312). Data may or may not be stored in the NVM package as tests for determining power consumption profiles is not data dependent.

At step 420, commands are issued to the NVM package so that each die is simultaneously accessed. Any suitable command may be issued such as read commands, program commands, or erase commands. In one embodiment, the commands can be read commands. The read commands may be any suitable read command capable of multiple simultaneous die access. The read commands may read a full block in each die or one or more pages in each die. In one embodiment, the read command may read a superblock (as discussed above). Using read commands in this manner can ensure that a maximum amount of power is utilized by the NVM package—by causing overlapping maximum current spikes in each die. Moreover, this intentionally invokes overlapping current spikes that effectively mimic current spikes that can occur on a verify path of each die during program operations. These overlapping maximum current spikes can be difficult to induce in conventional program operations, which is one reason read commands may be more advantageous in testing a NVM package to determine its maximum power consumption profile. Another advantage of using read commands, as opposed to program commands, is that read commands can be executed more quickly than program commands. In addition, there is no need to setup parallel piped program operations in a read command. Thus, in assembly line testing environments where it is desirable to minimize testing time, reading commands are advantageous.

Moreover, in some embodiments, issuing read commands to simultaneously access all die may be counterintuitive because there may not be a sufficient number of busses to output the data from all the die. Retrieving the data, however, is not necessary because the simultaneous read commands enable the process to determine the maximum power profile of the NVM package. In addition, issuing read commands to simultaneously access all die is not a use case that requires qualification. Further still, issuing such simultaneous commands can increase the likelihood of overlap of subcomponents (like sensing circuitry) of more complication operations (such as programming).

An advantage of using read operations (as opposed to program and erase operations) is that they can be repeated a large number of times without adversely affecting the life of the dies. This permits acquisition of relatively large sample sizes without additional complexity or time to do erase and program operations (as well as defect management from write or erase status failures).

At step 430, the NVM package power consumption is monitored during the simultaneous multi-die read operations. For example, power-monitoring circuitry 330 of FIG. 3 may monitor power consumption. The monitored power consumption may be recorded, as indicated by step 440. The information recorded may be raw data or some form of analyzed data. The analyzed data can include, for example, a maximum power consumption value, a maximum current consumption value, an average power or average current consumption value, or any suitable value derived from the raw data. The analyzed data may also indicate what sequence of simultaneously dispatched commands results in a worst case current spike.

In some embodiments, the recorded information may be stored in the NVM package. This may permit a system or NVM interface to access the stored information to determine how much power the NVM package can potentially consume. The system or NVM interface may be able to use this information to implement NVM power management.

At step 450, a determination is made if the power consumption during the simultaneous multi-die read operation is less than a predetermined threshold. This predetermined threshold can be a raw power consumption threshold or an analyzed power threshold (e.g., a max power or max current threshold, or an average power or average current threshold). If the determination at step 450 is YES, then the NVM package is qualified for use in an electronic device, as indicated at step 460. If the determination at step 450 is NO, then the NVM package is disqualified for use in an electronic device, as indicated at step 470.

The predetermined threshold may be selected based on the power supplying capability of a power management unit (e.g., PMU 130 of device 100 as shown in FIG. 1). In one embodiment, the threshold may be set such that a low performing PMU is able to adequately power any NVM package qualified for use in the electronic device.

Figure 5:
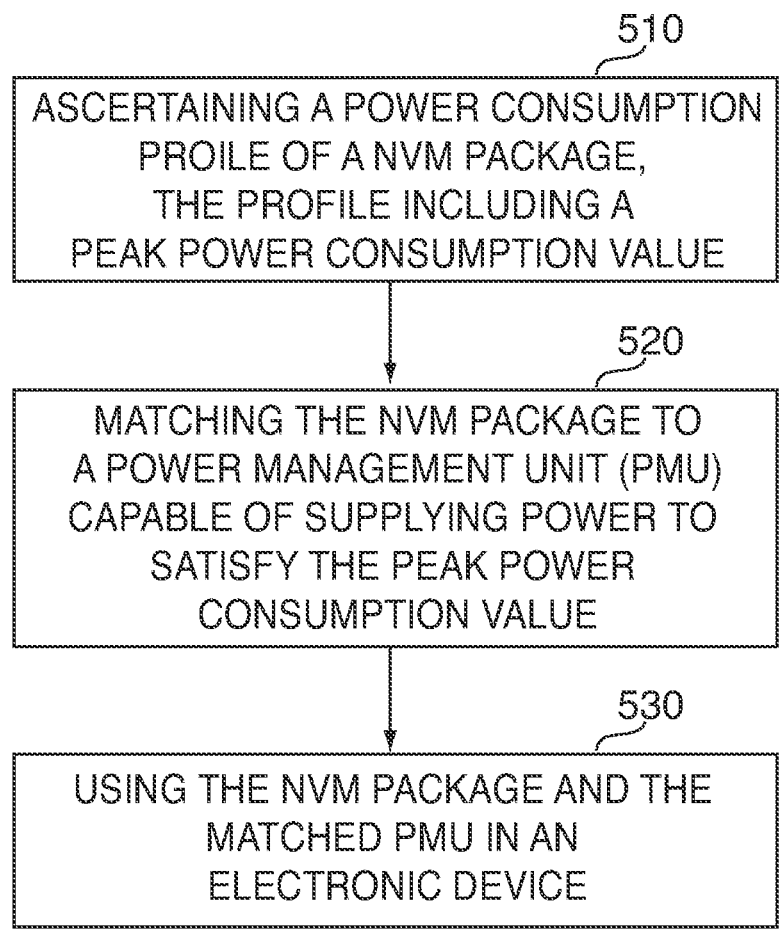
FIG. 5 is an illustrative flowchart showing steps for matching NVM packages with power management units (PMUs) in accordance with various embodiments of the invention.

FIG. 5 is an illustrative flowchart showing steps for matching NVM packages with power management units (PMUs) in accordance with an embodiment of the invention. Both NVM packages and PMUs may each have respective power profiles that vary from low performance to high performance. Using these power profiles, certain NVM packages may be matched with certain PMUs. Starting with step 510, a power consumption profile of a NVM package is ascertained. The power profile may include a peak power consumption value. For example, the power consumption profile may be obtained using the process discussed above in connection with FIG. 4.

Next, at step 520, the NVM package is matched to a PMU capable of supplying power to satisfy the peak power consumption value. Provided the PMU can satisfy the peak power consumption value for the NVM package, any suitable NVM package may be matched with that PMU. For example, a high performance PMU (e.g., a PMU known to supply power for any NVM package) may be matched to any NVM package having power consumption profiles ranging from low to high. In one embodiment, a high performance PMU can be matched with a NVM package having a relatively low power consumption profile. In another embodiment, a high performance PMU can be matched with a NVM package having a relatively high power consumption profile. Selectively matching NVM packages with PMUs may increase the yield throughput of both PMUs and NVM packages.

Next, at step 530, the matched NVM package and PMU are used in an electronic device. That is, they are eventually installed in the electronic device.

It should be understood that processes 400 and 500 of FIGS. 4 and 5 are merely illustrative. Any of the steps may be removed, modified, or combined, and any additional steps may be added, without departing from the scope of the invention.

The described embodiments of the invention are presented for the purpose of illustration and not of limitation.

What is claimed is:

1. A method for determining a power consumption profile of a non-volatile memory (NVM) package including a plurality of dies, chip enable lines and data bus lines, the method comprising:
   providing power to the NVM package;
   issuing commands to the NVM package so that each die is simultaneously accessed using the data bus lines to thereby invoke a maximum power consumption event by the NVM package, wherein the plurality of dies is greater in number than the number of data bus lines;
   using the chip enable lines to enable each die of the plurality of dies during the maximum power consumption event;
   monitoring NVM package power consumption during the maximum power consumption event to obtain a power consumption profile of the NVM package;
   analyzing the power consumption profile; and
   qualifying the NVM package for use in an electronic device based on the analyzed power consumption profile.

2. The method of claim 1, wherein the commands issued to the NVM package are read commands.

3. The method of claim 1, further comprising:
   recording monitored NVM package power consumption data.

4. The method of claim 1, wherein analysis of the power consumption profile provides a peak power consumption value.

5. The method of claim 1, further comprising:
   determining whether a value associated with the power consumption profile is less than a predetermined threshold; and
   qualifying the NVM package for use in an electronic device if the value is determined to be less than the predetermined threshold, or disqualifying the NVM package for use in the electronic device if the value is determined not to be less than the predetermined threshold.

6. The method of claim 1, wherein the issued commands are program or erase commands.

7. The method of claim 1, wherein the NVM package is a Nand flash NVM package.

8. A system for use in testing a non-volatile memory (NVM) package including a plurality of dies, the system comprising:
   power monitoring circuitry operative to monitor power consumed by the NVM package, wherein the NVM package includes a plurality of chip enable lines and data bus lines, wherein the plurality of dies is greater in number than the number of data bus lines; and
   testing circuitry electrically coupled to the NVM package, the plurality of chip enable lines, and the power monitoring circuitry, the testing circuitry operative to:
      issue commands to the NVM package to simultaneously access each of the plurality of dies to thereby invoke a maximum power consumption event by the NVM package;
      enable each die of the plurality of dies during the maximum power consumption event;
      receive power consumption data from the power monitoring circuitry;
      analyze the received power consumption data; and
      qualify the NVM package for use in an electronic device based on analysis of the received power consumption data.

9. The system of claim 8, wherein the issued commands are read commands.

10. The system of claim 8, wherein the issued commands are program or erase commands.

11. The system of claim 8, wherein the testing circuitry is further operative to:
   analyze the received power consumption data to obtain a peak power consumption value during the peak power consumption event.

12. The system of claim 11, wherein the testing circuitry is further operative to use the peak power consumption value when qualifying the NVM package for use in the electronic device.

13. The system of claim 8, wherein the NVM package is qualified for use with a power management unit.

14. A method for matching a power management unit with a non-volatile memory (NVM) package, the method comprising:
   ascertaining a power consumption profile of the NVM package, the profile including a peak power consumption value, and wherein the NVM package includes a plurality of dies, wherein ascertaining the power consumption profile comprises:
      issuing a read command that results in each die being simultaneously accessed to cause each die to consume its maximum potential current such that the peak power consumption value of the overlapping maximum current consumption of the plurality of dies is obtained for the power consumption profile;
   matching the NVM package to a power management unit (PMU) capable of supplying power to satisfy the peak power consumption value; and
   using the NVM package and the matched PMU in an electronic device.

15. The method of claim 14, wherein the matching comprises:
   determining a power output of a plurality of PMUs; and
   selecting a PMU having a power output that exceeds the peak power consumption value.

16. The method of claim 14, wherein the ascertaining comprises simultaneously reading each of the plurality of dies to invoke a peak power consumption event.

17. The method of claim 14, wherein the NVM package is a Nand flash NVM package.

* * * * *